United States Patent
Carter

(10) Patent No.: US 8,599,310 B2
(45) Date of Patent: Dec. 3, 2013

(54) AUDIO AND VIDEO CLOCK SYNCHRONIZATION

(75) Inventor: Collis Quinn Carter, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 13/325,807

(22) Filed: Dec. 14, 2011

(65) Prior Publication Data

US 2012/0169930 A1  Jul. 5, 2012

Related U.S. Application Data

(60) Provisional application No. 61/422,889, filed on Dec. 14, 2010.

(51) Int. Cl.
*H04N 9/475* (2006.01)

(52) U.S. Cl.
USPC ......................................... 348/515

(58) Field of Classification Search
USPC .................................................. 348/512, 515
See application file for complete search history.

(56) References Cited

U.S. PATENT DOCUMENTS

| | | | | |
|---|---|---|---|---|
| 5,652,627 A | * | 7/1997 | Allen | 348/497 |
| 5,784,119 A | * | 7/1998 | Noda et al. | 348/512 |
| 5,881,114 A | * | 3/1999 | Moon | 375/376 |
| 6,151,076 A | * | 11/2000 | Hoffman et al. | 348/512 |

* cited by examiner

*Primary Examiner* — Michael Lee
(74) *Attorney, Agent, or Firm* — Sterne, Kessler, Goldstein & Fox P.L.L.C.

(57) ABSTRACT

Provided herein is a method for synchronizing audio and video clock signals in a system. The method includes comparing, within a comparison module, a system video signal with the determined mathematical relationship to produce an adjustment signal. A system video reference signal is updated with the adjustment signal to produce an updated intermediate signal.

23 Claims, 6 Drawing Sheets

AUDIO AND VIDEO CLOCK SYNCHRONIZATION

CROSS-REFERENCE TO RELATED APPLICATIONS

This application claims the benefit of U.S. Provisional Application No. 61/422,889, filed on Dec. 14, 2010 and is incorporated by reference in its entirety.

BACKGROUND OF THE INVENTION

1. Field of the Invention

The present invention generally relates to time reference management in audio and video systems.

2. Background Art

Accurate playback of audio/visual media can be problematic for the audio and video subsystems, such as those used in conventional computer systems. For example, when digital video discs (DVDs) are played on laptop computers, audio and pixel clocks, within the lap top's audio and video subsystems, can drift apart. This drift can cause the movie's audio and video tracks to lose their synchronization, creating artifacts in the display.

Drift reduction techniques used in the conventional computer systems typically drop or repeat frames to compensate for this drift between the audio and video tracks. However, dropping or repeating frames can be quite noticeable to a user, and is therefore less than optimal.

These conventional computer systems typically use a crystal based timing reference signal to provide a global clock reference. The use of a global clock reference, however, does little to eliminate the problem of drift noted above.

What is needed, therefore, are methods and systems to more efficiently synchronize the audio and video tracks of audio/visual media to substantially eliminate or reduce the occurrence of drift.

BRIEF SUMMARY OF EMBODIMENTS OF THE INVENTION

Embodiments of the present invention meet the above-identified needs by providing a method for synchronizing audio and video clock signals in a system. The method includes comparing, within a comparison module, a system video signal with the determined mathematical relationship to produce an adjustment signal. A system video reference signal is updated with the adjustment signal to produce an updated intermediate signal.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
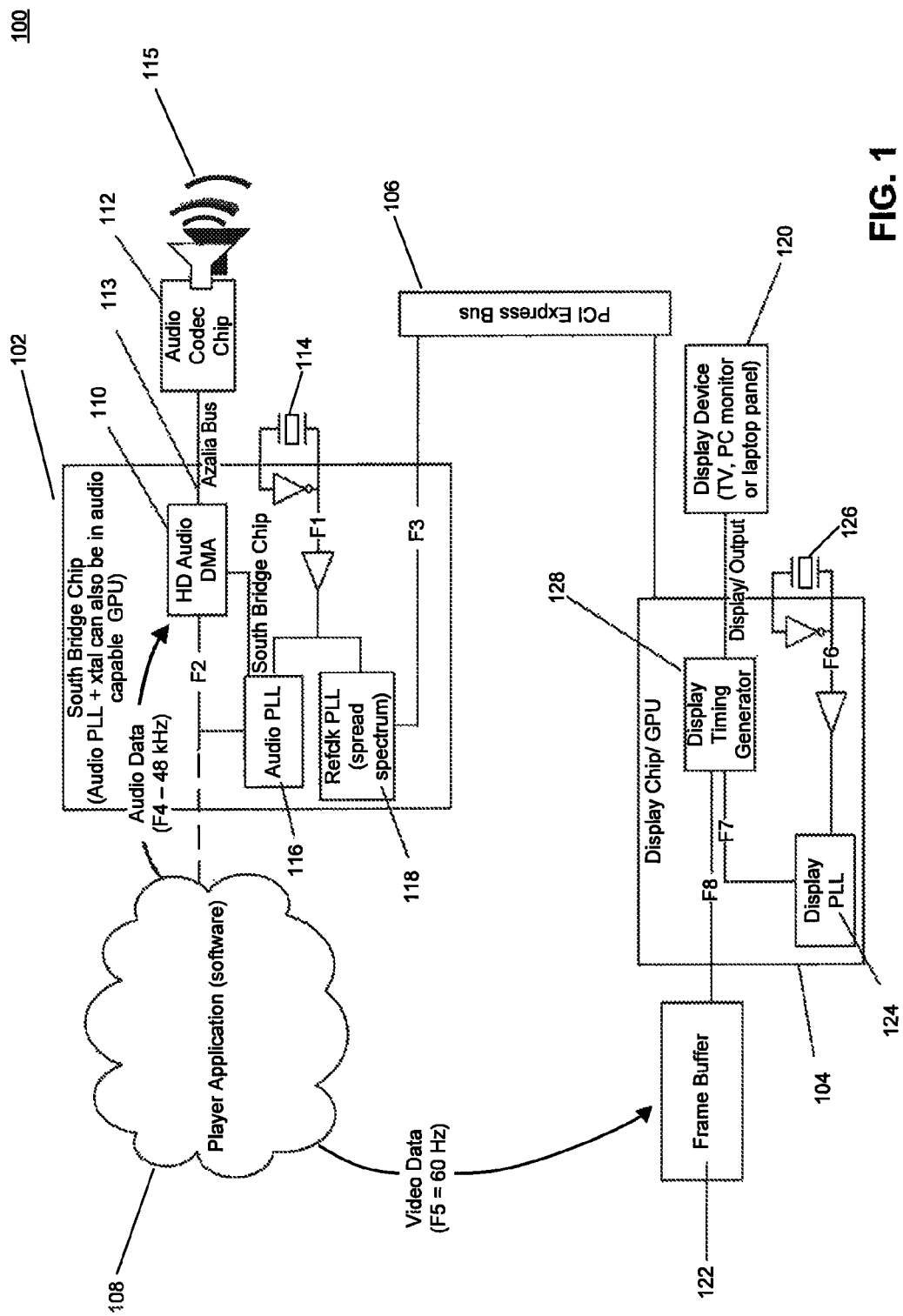
FIG. 1 is a block diagram illustration of an conventional audio-video system.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF EMBODIMENTS OF THE INVENTION

In the detailed description that follows, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIG. 1 is a block diagram of a conventional audio video system 100. The system 100 includes a south bridge chip (SB) 102 and a processor, such as display chip/graphics processing unit (GPU) 104. Display chip/GPU 104 can assist a central processing unit (CPU), not shown, by performing graphics-processing tasks, data-parallel and general-compute tasks, usually faster than the CPU. In embodiments of the present invention, display chip/GPU 104 can be integrated into a chipset including the CPU or other processors.

In system 100, clock frequencies, 60 Hz and 48 kHz, are independently derived and are used for video and audio generation, respectively. Each of the frequencies is derived from respective crystal clocks. For example, the 48 kHz audio signal is derived from a crystal clock within SB 102. Similarly, the 60 Hz video signal is derived from a crystal clock within display chip/GPU 104. A peripheral component interface express (PCIe) bus 106 provides an interface between SB 102 and display chip/GPU 104 and facilitates synchronization of timing information.

In FIG. 1, a player application device 108, which could be a DVD player, an audio signal with the aid of a high definition (HD) audio direct memory access (DMA) device 110. The HD audio device 110 is coupled to an audio codec chip 112 via a bus 113 (e.g., an Azalia bus) and provides an HD audio output signal to an audio output device, such as a speaker 115.

A first conventional crystal clock 114 is used to produce a timing reference frequency F1 for the SB chip 100. In FIG. 1, F1 has a nominal frequency value and a frequency error $\Delta_1$. The frequency error $\Delta_1$ is a function of the crystal 114, along with current operating temperature and voltage. All frequencies derived from F1 will have the same error plus possible additional errors if a phase locked loop (PLL) or other rate generation circuit cannot be programmed to generate exactly the desired frequency relative to F1.

In the conventional system 100, F1 is used to produce frequency F2, a master audio clock frequency signal. F2, in conjunction with HD audio DMA 110, is used to generate the HD audio output signal. An output of HD audio DMA 110 provides F2 as an input to an audio PLL 116 for phase comparison with F1. Audio PLL 116, unfortunately, can introduce its own inherent frequency error.

Audio master clock signal F2 is typically 24 MHz for HD audio and includes an error $\Delta_1$ since it is derived from frequency F1. F2 is combined with F1 via audio PLL 116 and a refclk 118, to produce audio reference signal F3.

Frequency F3 becomes the reference frequency for system 100. Frequency F3 is generated by refclk 118 and impacts timing of system 100. F3 is typically a maximum of 100 MHz with down-spread. Frequency F3 includes the error $\Delta_1$ since it is derived from F1. Frequency F3 has a fixed (but not necessarily known) relationship with frequency F2 as long as both are derived from frequency F1. Frequency F3 is sent to player application 108 as a virtual clock via a readable counter (not shown).

Display chip/GPU 104 is coupled to a display device 120 and to a frame buffer 122. Display chip/GPU 104 includes display PLL 124, which generates the pixel clock frequency F7. Display PLL 124 is coupled to a second conventional crystal clock 126, which provides an independent timing reference signal F7 which is used by display timing generator 128 to establish video data frame rates associated with display chip/GPU 104.

The crystal clock 126 produces a frequency signal F6 which drives the display chip/GPU 104. F6 has a nominal frequency value and a frequency error $\Delta_2$. The frequency error $\Delta_2$ is a function of the crystal clock 126, as well as the current operating temperature and voltage. F7 also includes the frequency error $\Delta_2$, since it is derived from frequency F6.

Timing generator 128 generates a frame rate frequency F8. F8 is the display frame rate for frame buffer 122 and determines the frequency pixels will be output to. In the example of FIG. 1, F8 is 60 Hz. However, F8 contains frequency error $\Delta_2$ in addition to any other error in resident in F7.

Frequency F4 is the audio sample rate. In this example, F4 is 48 kHz, but contains frequency error $\Delta_1$ in addition to any other error in F2. Frequency F5 is the video playback frame rate, and includes the error $\Delta_1$ since it is derived from F1.

In conventional system 100, F5 is also 60 Hz. The 60 Hz rate was derived from the audio rate F2 and therefore includes a certain amount of error. Notably, each distinct signal contains various error degradations that can contribute to timing differences.

As noted above, the 60 Hz and 48 kHz frequencies are derived from independent references and within system 100, drifting relative to one another during operation. The result is that if player application 108 is playing a movie, where the movie is slaved to the audio master clock signal F2, the corresponding video frame rate will either be too fast or too slow. To resolve these timing differences, frames will have to be skipped or repeated periodically, as noted above. This skipping and repeating of frames produces noticeable discontinuities in the frame rate. For example, the playback can occasionally flicker at regular intervals.

Figure 2:
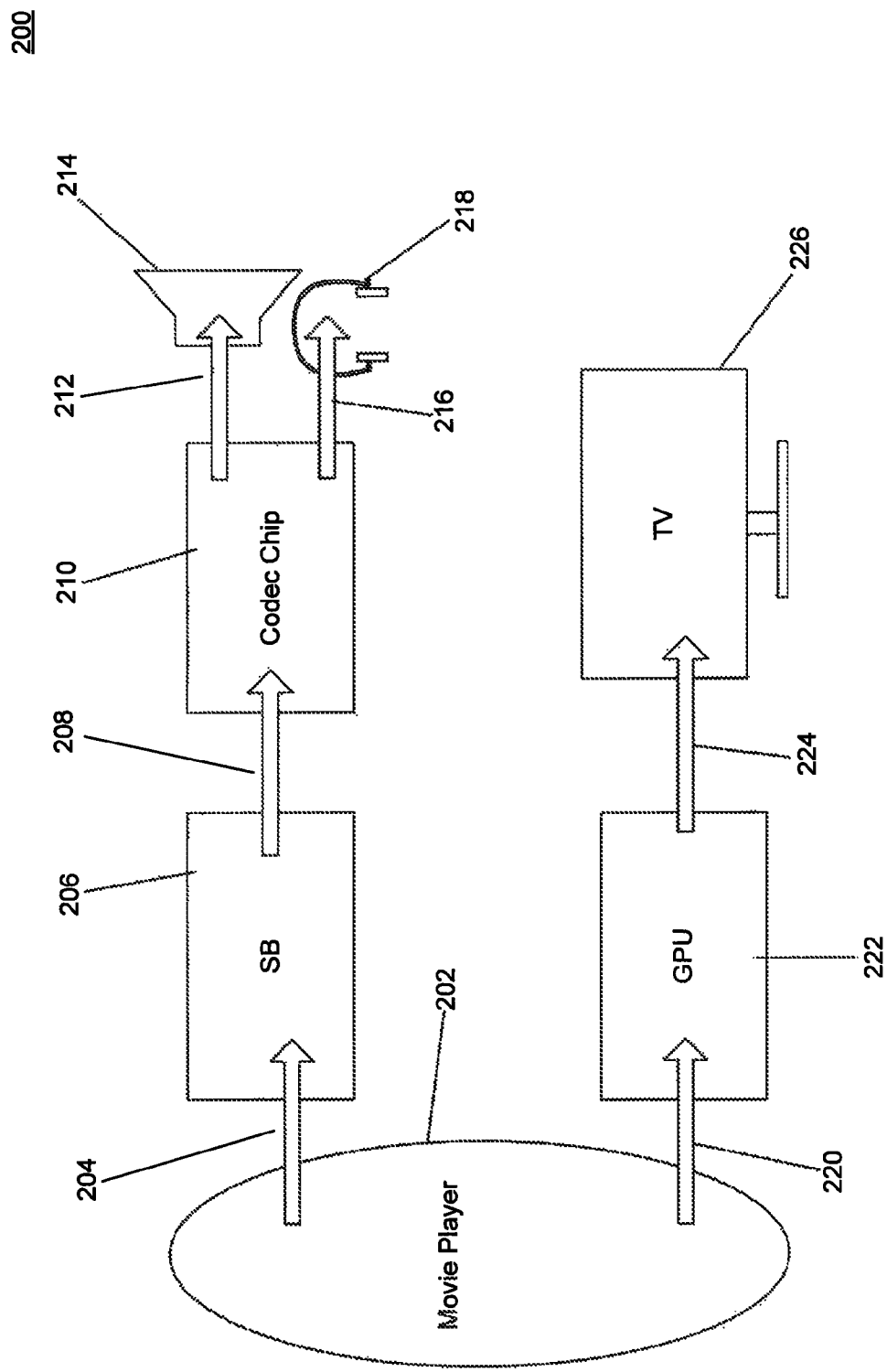
FIG. 2 is a block diagram illustration of a conventional media module in which embodiments of the present invention can be applied.

FIG. 2 is a block diagram of a conventional media module 200. Media module 200 includes a movie player 202, an SB 206, a codec chip 210, a speaker system 214 and an earphone system 218. Media module 200 also includes a GPU 222, and a display unit (TV) 226. Display unit 226 can include, for example, a laptop, a flat panel display, a liquid crystal display (LCD), and other types of displays apparent to a person skilled in the art.

Movie player 202 is capable of streaming video and audio via buses 204 and 220 to SB 206 and GPU 222, respectively. Movie player 202 is representative of software that can be stored on a CPU (not shown) attachable to various other hardware devices. The master rate reference of the CPU can be used by the software to control rates of data transfer and master rate, such as the 48 kHz and 60 Hz rates of the video and audio frames, noted above.

SB 206 sends audio output to a codec chip 210 via bus 208. GPU 222 sends video output to display unit 226 via bus 224. Codec chip 210 sends audio via a bus 212 to speaker system 214. Similarly, codec chip 210 sends audio data to earphone system 218 via bus 216.

Busses 204 and 220 may be any type of bus used in computer systems, including a peripheral component interface (PCI) bus, an accelerated graphics port (AGP) bus, a PCIe bus, or any other suitable type of bus.

Movie player 202 outputs each of the audio and video streams via busses 204 and 220, respectively, and slaves to one reference signal, such as a reference signal associated with SB 206. If, for example, TV 226 represents a laptop's display and is connected to speaker system 214, it can be difficult to synchronize the rates between TV 226 and speaker system 214. Consequently, content to be displayed on TV 226 will be choppy.

Figure 3:
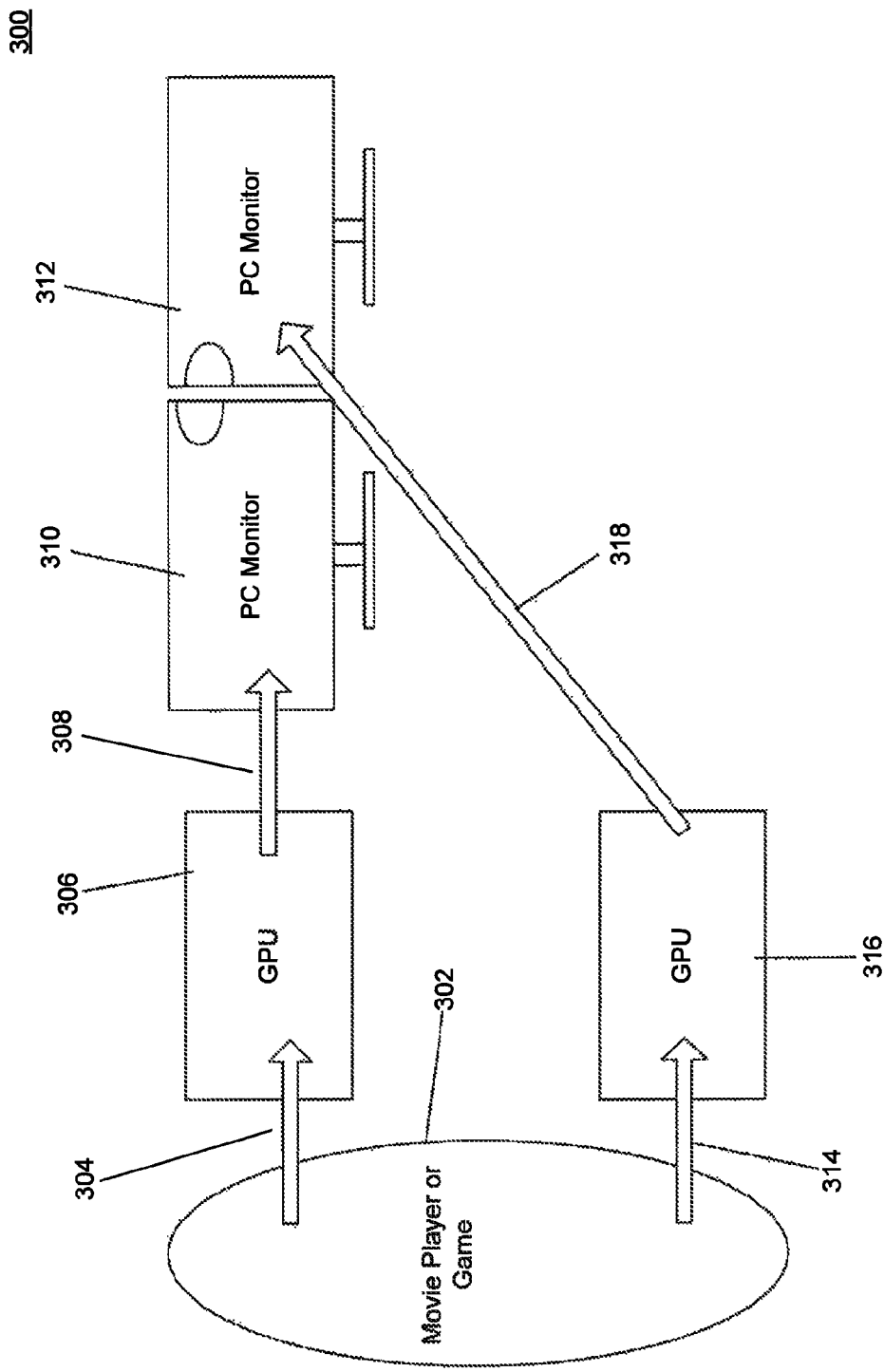
FIG. 3 is a block diagram illustration of an audio-visual system having multiple monitor-speaker paired units used to create a single large display surface in which embodiments of the present invention can be applied.

FIG. 3 is an example of another conventional system with less than optimal abilities for synchronizing audio and video rates. More particularly, FIG. 3 is a block diagram illustration of a conventional system 300 involving the use of multiple monitors to create an infinity display effect. That is, conventional system 300 uses multiple monitors connected such that each monitor is driven by different components. In the absence of a high definition multi-media interface (HDMI) or a dedicated display port, such a system would likely include an integrated graphics card and a discrete graphics card to drive the multiple monitors.

Multiple monitor systems are commonly used in surround sound arrangements, where each monitor could be associated with an integrated pair of speakers. In these systems, six or more speakers can be used to produce the surround sound sensation. For example, such a system can include left and right front channel speakers, a center channel speaker, left and right side channel speakers, along with left and right rear channel speakers. In these systems, problems occur when the audio playback is not properly synchronized with the video playback—significantly degrading the quality of a user's experience.

Once consequence of unsynchronized audio and video rates in a surround sound system is the production of phase differences. The human ear is very sensitive to phase differences and perceives them as a form of auditory distortion. For example, in a surround sound scene including audio of a helicopter moving from left-to-right on the monitors, phase differences can result in the audio erroneously tracking from right-to-left, contrary to what the user visually perceives.

System 300 includes a movie player 302, such as a DVD player. The movie player 302 streams video and audio data via a bus 304 to a GPU 306. GPU 306 outputs corresponding image data, via a bus 308, to a monitor 310.

System 300 includes a monitor 312. Correspondingly, movie player 302 streams video and audio data via a bus 314 to a GPU 316. GPU 316 outputs corresponding image data, via a bus 318, to monitor 312. Monitors 310 and 312 are configured to operate as a single large monitor. System 300, however, also lacks independently derived system timing references—propagating errors from a single reference through the entire system.

In addition to audio discontinuities discussed above, visible motion discontinuities also from an inability to synchronize respective frame rates. That is, aspects of an object spanning monitors 310 and 312, operating as a single large monitor, will appear out of synch and degraded. To resolve this problem, one of the two different monitors' reference signals must act as a synchronization reference. It is also possible to have an SB, acting as a master, or one or the other of the GPUs acting as a master. Nevertheless, there can only be one timing master reference clock.

One conventional approach used in industry, to resolve timing differences, is a clocking technique. Clocking techniques activate all the frames at the same time such that whenever any action occurs, the action is properly synchronized. If an image moves from monitor-to-monitor, in the case of a moving object, refresh artifacts will be minimized. This can be achieved by using a single GPU since all the monitors will be based on a single timing reference. However, when the monitors 310 and 312 are coupled to separate devices, such as with integrated graphics cards 306 and 316, there is no synchronization mechanism to ensure the monitors operate at the same rate for the same length of time.

Figure 4:
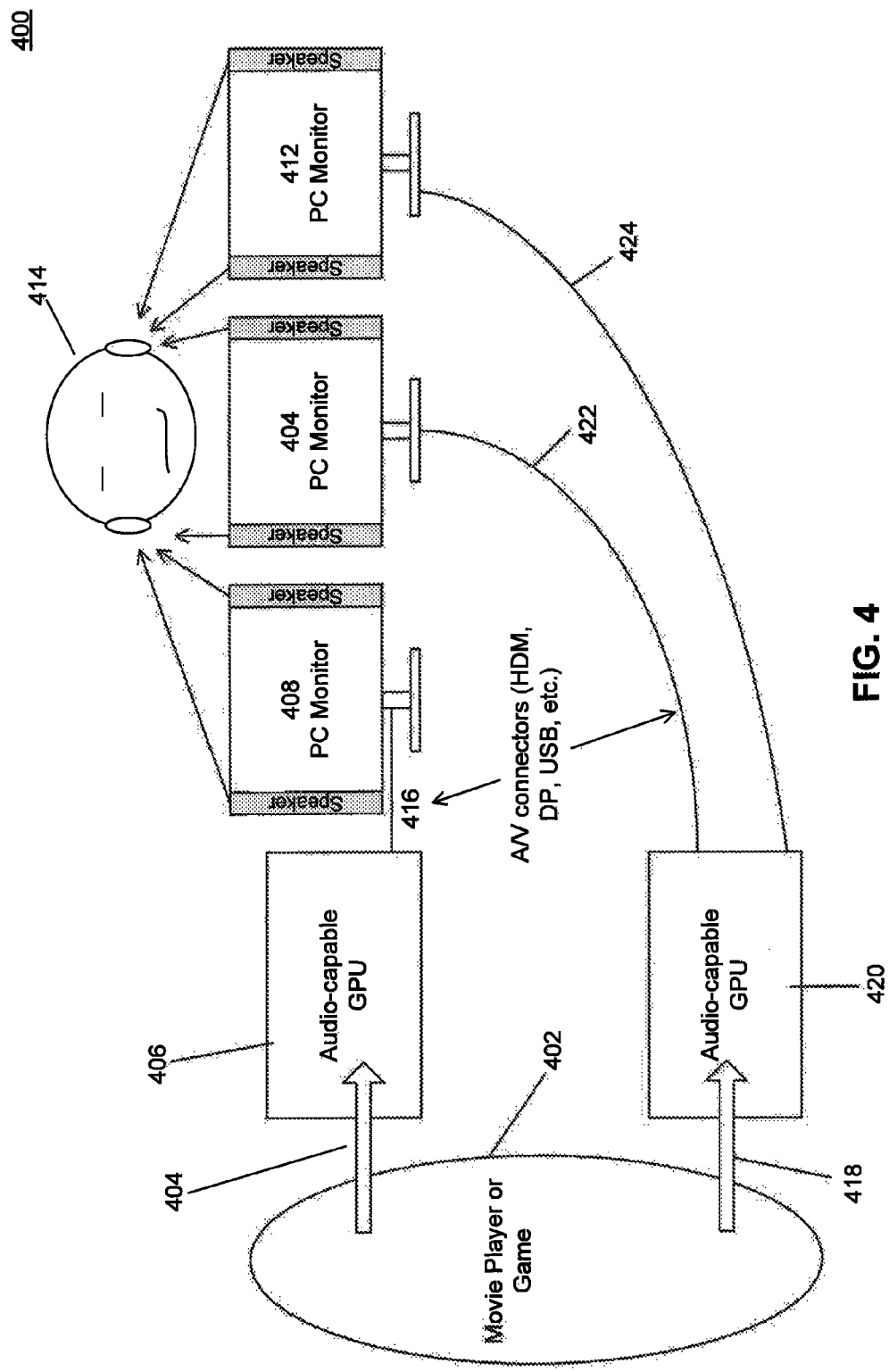
FIG. 4 is a block diagram illustration of an audio-visual system for producing audio and graphics using multiple audio-capable graphics processing units (GPUs) connected to multiple monitor-speaker paired units in which embodiments of the present invention can be applied.

FIG. 4 is a block diagram illustration of a conventional surround sound audio-video system 400 in which phase differences occurs and diminish the system's performance. More specifically, in system 400, each components' speakers are phase-aligned and frequency-locked to produce the surround effect without the need of special audio-visual equipment. Those of skill in the art will recognize system 400 as an audio-to-audio/video-to-video arrangement.

In system 400, a movie player 402 is capable of streaming video and audio via buses 404 and 418 to respective audio-capable GPUs 406 and 420. System 400 is commonly used to deliver 5.1 or 6.1 surround sound audio.

For example, a 5.1 or 6.1 surround sound audio clip is typically split into three pairs of audio streams 416, 422, and 424, and fed respectively to three different monitors 408, 410, and 412. In system 400, by manipulating the audio content, in lieu of physically positioning speakers, the sound perceived by a listener 414 is similar to the type of surround sound produced by physically positioned speakers. The surround sound effect produced by system 400 uses phase alignment between the speakers to achieve a surround sound equivalent user experience. In system 400, this equivalent surround sound effect is possible as long as individual speakers are phase-aligned within less than one microsecond. Frequency lock is a necessary condition for consistent phase alignment at this level.

In order to reliably create such a surround sound equivalence, it's necessary to ensure that both frequency and phase of the audio outputs from the two audio-capable GPUs 406 and 420 are sufficiently matched.

Unfortunately, the basic infrastructure in place, for example, in today's personal computer (PC) market to provide consistent phase alignment for surround sound equivalent perception is not readily available.

Figure 5:
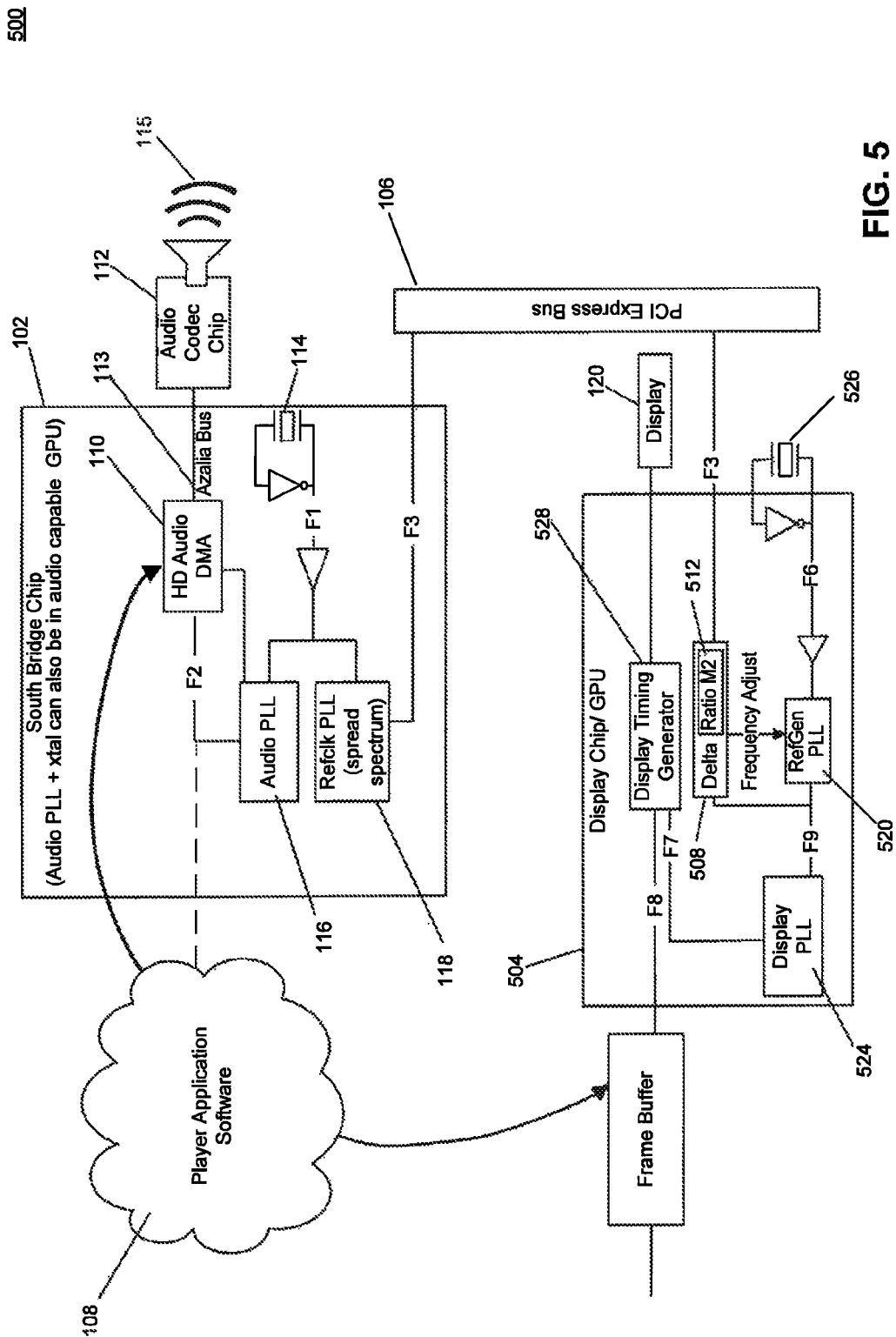
FIG. 5 is a block diagram illustration of an audio-video system constructed in accordance with embodiments of the present invention.

FIG. 5 is a block diagram illustration of an audio/video system 500 constructed in accordance with embodiments of the present invention. In audio/video system 500, as discussed with reference to FIG. 1, timing reference frequency F1 is used as a global clock reference and is distributed throughout SB 102. F1 is used within system 500 as a clean frequency reference to which all other component clocks, within audio/video system 500, are compared and synchronized.

More particularly, in audio/video system 500, F1 can be used as a system wide global reference as opposed to being used as an independent crystal reference frequency, as discussed above with regard to FIG. 1.

In the illustrative embodiment of FIG. 5, all the clock rates associated with all other system components will have a common source. Inventors of subject matter included in the present application have discovered that this approach is the most effective and efficient mechanism to achieve system wide synchronization in both audio and video frames, with relatively zero error. This level of synchronization cannot be achieved in conventional systems, such as those discussed above with reference to FIGS. 1-4.

The SB 102 in audio/video system 500, as well as other similarly numbered components, function the same as they do in FIG. 1. In audio/video system 500, SB chip 102 guarantees a relationship between master audio clock frequency signal F2 and a reference clock F3, which are the audio rates used for the PCIe bus 106. A ratio of these related rates is made available to the components within audio/video system 500 that rely on master audio frequency signal F2, as described in greater detail below.

Audio/video system 500 also includes a display chip/GPU 504. Display chip/GPU 504 includes a delta measurement block 508 coupled to PCIe 106, a refgen PLL 520, and a display PLL 524. Delta measurement block 508 includes a comparison mechanism 512 to determine a ratio between an intermediate frequency F9 and F3. In system 500, refgen PLL 520 is coupled to an output of a crystal clock 526 and display PLL 524.

Refgen PLL 520 is configured to compensate for the frequency error of F1. More specifically, refgen PLL 520 adjusts an input clock frequency signal F6 with an F3 error value. For example, refgen PLL 520 takes a measurement of the error between the rate F3, which it receives external to display chip/GPU 504, and the signal F6, which it receives internally, and determines adjustments that needed long-term so that F9 represents the exact crystal error of F1 (i.e. $\Delta_1$). This is achieved by an analysis of the ratio between F3, a known reference frequency, and the crystals associated with components coupled to PCIe bus 106.

In embodiments of the present invention, the relationship between master audio rate F2 and reference rate F3 should be as precise as possible. By way of example, although, F1 is typically 100 MHz, including the % or parts per million (ppm) error $\Delta_1$ associated with F1. F3, for example, is 100 Mhz, with error $\Delta_1$ and down-spread amount $S_1$.

This is a practical constraint since, for example, if F1 is 25 MHz, audio PLL 116 can include a feedback divider and a post-divider to output F2=F1*24/25=24 MHz with essentially zero error relative to F1.

Similarly, refclk PLL 118 can include a feedback divider and a post-divider to output F3=F1*40/10=100 MHz with essentially zero error relative to F1.

A down-spread profile of 0.5% down can be superimposed on F3 by using a fractional feedback divider and by stepping the feedback divider between 40, 39.9 and 3.98 at regular intervals relative to the VCO output clock. This process will produce an average frequency of 99.75 MHz (0.25% below 100 MHz) with essentially zero error relative to frequency F1.

At this point, F2/F3 is a known value M10 (i.e. 24/99.75) So, a device receiving reference frequency F3, can compute F2 by implementing a frequency multiplier, as understood by those of skill in the art.

Refgen PLL 520 produces intermediate frequency F9 which is nominally equivalent to signal F6. Delta measurement block 508 compares frequency F9 with frequency F3, taking into account the expected frequency ratio between F3 and F9.

Based on the error between the two frequencies F3 and F9, (which is the difference between $\Delta_1$ (error in F1) and $\Delta_2$ (error in F6), respectively, a mathematical frequency adjust operation 512 (e.g., a divide operation) is applied to refgen PLL 520 such that F9 will have the error $\Delta_1$. Frequency adjust 512 can be applied in a very damped fashion since error $\Delta_1$ changes very slowly. Applying the frequency adjust operator 512 allows minimal jitter and no spread on F9 even though it is tracking a high jitter spread value inherent to F3.

Frequency F9 can now be used to allow display chip/GPU 504's display PLL 524 to generate frequency F7 with no additional error relative to frequency F9. Further, display timing generator 528 generates frame rate signal F8 with no additional error relative to frequency F7 in order to ensure that frame rate signal F8 has zero error relative to audio master clock rate F2.

In this manner, refgen PLL 520 generates a new reference and can feed that reference into all of the devices plugged into the PCIe bus 506 as if their timing source coming plugged directly into crystal clock 114. By applying techniques based upon embodiments of the present invention, crystal clock 526 becomes virtually modified with its inherent error removed, and the error of the crystal clock 514 inserted in its place.

As long as the system devices are plugged into the PCIe bus 106 and use techniques such as those described above, then these devices can use F3 to derive their own internal frequencies in the system and eliminate the drift associated with achieving synchronization in conventional audio video systems.

Figure 6:
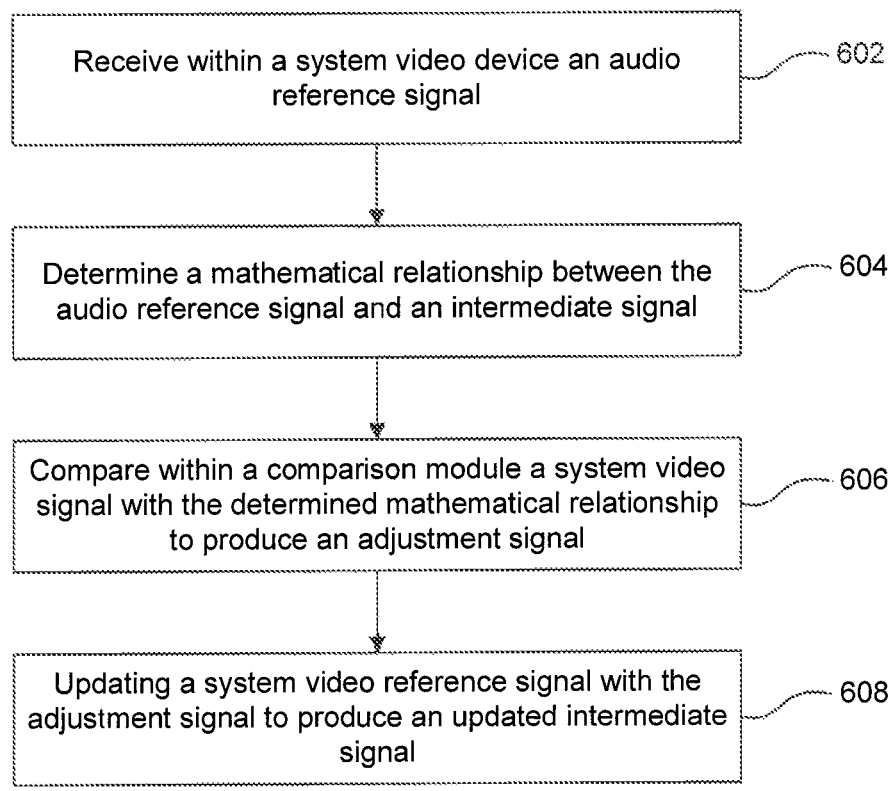
FIG. 6 is a flow chart of an exemplary method of practicing an embodiment of the present invention.

FIG. 6 is a flow chart of an exemplary method 600, according to an embodiment. At step 602 of method 600, an audio reference signal is received within a system video device. Method 600 proceeds to step 604, where a mathematical relationship is determined between the audio reference signal and an intermediate signal. At step 606, a comparison module compares a system video signal with the determined mathematical relationship to produce an adjustment signal. Method 600 proceeds to step 608 where a system video reference signal is updated with the adjustment signal to produce and updated intermediate signal.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A method for synchronizing audio and video clock signals, comprising:
   determining a first frequency error by calculating a first ratio between an audio reference signal and a master audio clock frequency signal of an audio device;
   generating an adjustment signal based on a comparison of the first frequency error and a second frequency error associated with an intermediate signal of a video device; and
   synchronizing the video and audio clock signals, wherein the synchronizing comprises updating a video reference signal with the adjustment signal to produce an updated intermediate signal.

2. The method of claim 1, wherein the audio reference signal is a function of an input clock reference frequency.

3. The method of claim 2, wherein the input clock reference frequency is produced in accordance with clock source of the video device.

4. The method of claim 1, further comprising updating video frame rates based upon the updated intermediate signal.

5. The method of claim 1, wherein the audio reference signal is produced in accordance with a clock source of the audio device.

6. The method of claim 5, wherein the clock source of the audio device produces an audio clock signal having a predetermined error value.

7. The method of claim 6, wherein the error value of the audio clock signal is substantially equal to an error value of the updated video signal.

8. A system comprising:
   a video device including a video clock;
   wherein the video device is configured to determine a first frequency error by calculating a first ratio between an audio reference signal and a master audio clock frequency signal of an audio device, generate an adjustment signal based on a comparison of the first frequency error and a second frequency error associated with an intermediate signal of the video device and update a video reference signal with the adjustment signal to produce an updated intermediate signal used to synchronize the video clock with an audio clock, the audio reference signal being produced in accordance with the audio clock.

9. The system of claim 8, wherein the video device includes,
   a first video comparison mechanism having one input coupled to the video clock;
   a second video comparison mechanism coupled to an output of the first video comparison mechanism; and
   a frequency adjuster having one output coupled to another input of the first video comparison mechanism and an input coupled to the output of the first video comparison mechanism.

10. The system of claim 9, wherein the frequency adjuster performs the update of the video timing signal.

11. The system of claim 10, wherein the frequency adjuster includes another output coupled to the interface; and
   wherein the frequency adjuster is configured to update subsequent video timing signals based upon previous video timing signals output from the first video comparison mechanism.

12. The system of claim 11, wherein the video device (i) includes a display timing generator coupled to an output of the second comparison mechanism and (ii) is configured to drive a display.

13. The system of claim 12, wherein the frequency adjuster includes another input coupled to the second video comparison mechanism and another output coupled to the interface.

14. The system of claim 13, wherein the audio device includes an audio generator and an audio comparison mechanism; and wherein the audio clock is coupled to one port of the audio comparison mechanism and the audio generator is coupled to another port thereof.

15. The system of claim 14 wherein an output of the audio comparison mechanism is coupled to the one port of the interface.

16. A video device comprising:
   a first video comparison mechanism having one input coupled to a clock;
   a second video comparison mechanism coupled to an output of the first video comparison mechanism; and
   a frequency adjuster having an output coupled to another input of the first video comparison mechanism, one input coupled to an output of the first video comparison mechanism, and another input coupled to the interface, the frequency adjustor configured to generate an adjustment signal based on a comparison of a first frequency error associated with an audio reference signal and a second frequency error associated with an intermediate signal of the video device and update a video reference signal with the adjustment signal to produce an updated intermediate signal used to synchronize a video clock with an audio clock.

17. The device of claim 16, further comprising a display timing generator coupled to an output of the second comparison mechanism and configured to drive a display.

18. The device of claim 17, wherein the display timing generator, the frequency adjuster, and the first and second comparison mechanisms are formed on a single integrated circuit (IC).

19. The device of claim 18 wherein the IC includes a graphics processing unit (GPU).

20. The method of claim 1, wherein generating the adjustment signal comprises:
   determining the first frequency error by calculating a first ratio between the audio reference signal and a master audio clock frequency signal of the audio device.

21. The method of claim 20, wherein generating the adjustment signal further comprises:
   determining the second frequency error, wherein determining comprises:
   calculating a second ratio between the intermediate signal and audio reference signal; and
   determining a delta between the second ratio and the first ratio.

22. The method of claim 21, further comprising:
   assigning the delta to the adjustment signal; and
   updating the intermediate signal based on the assigned delta, wherein updating comprises decreasing or increasing the intermediate signal to match the audio reference signal.

23. A system comprising:
   a video device including a video clock,
   the video device configured to generate an adjustment signal based on a comparison of the first frequency error associated with an audio reference signal and a second frequency error associated with an intermediate signal of the video device and update a video reference signal with the adjustment signal to produce an updated intermediate signal used to synchronize the video clock with an audio clock, the audio reference signal being produced in accordance with the audio clock, wherein the video device includes:
   a first video comparison mechanism having one input coupled to the video clock;
   a second video comparison mechanism coupled to an output of the first video comparison mechanism; and
   a frequency adjuster having one output coupled to another input of the first video comparison mechanism and, an input coupled to the output of the first video comparison mechanism.

* * * * *